United States Patent
Tsai et al.

(10) Patent No.: US 9,830,992 B1
(45) Date of Patent: Nov. 28, 2017

(54) OPERATION METHOD OF NON-VOLATILE MEMORY CELL AND APPLICATIONS THEREOF

(71) Applicant: MACRONIX INTERNATIONAL CO., LTD., Hsinchu (TW)

(72) Inventors: Wen-Jer Tsai, Hualien (TW);
Wei-Liang Lin, Taipei (TW);
Chih-Chieh Cheng, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/362,052

(22) Filed: Nov. 28, 2016

Related U.S. Application Data

(60) Provisional application No. 62/363,349, filed on Jul. 18, 2016.

(51) Int. Cl.
| | |
|---|---|
| *G11C 16/04* | (2006.01) |
| *G11C 16/26* | (2006.01) |
| *G11C 16/34* | (2006.01) |
| *G11C 11/56* | (2006.01) |
| *G11C 16/14* | (2006.01) |

(52) U.S. Cl.
CPC .......... *G11C 16/26* (2013.01); *G11C 11/5671* (2013.01); *G11C 16/14* (2013.01); *G11C 16/3445* (2013.01); *G11C 16/3459* (2013.01)

(58) Field of Classification Search
CPC ..................................................... G11C 16/04
USPC ...................................................... 365/185.03
See application file for complete search history.

(56) References Cited

U.S. PATENT DOCUMENTS

| | | | |
|---|---|---|---|
| 7,117,296 B2 | 10/2006 | Hosono et al. | |
| 7,420,846 B2 | 9/2008 | Chen et al. | |
| 8,942,047 B2 | 1/2015 | Mui et al. | |
| 2004/0264253 A1* | 12/2004 | Hirano | G11C 16/16 365/185.29 |
| 2006/0114719 A1* | 6/2006 | Lee | G11C 16/04 365/185.17 |
| 2008/0137409 A1 | 6/2008 | Nakamura et al. | |
| 2013/0135938 A1* | 5/2013 | Fujiki | G11C 16/26 365/185.19 |
| 2013/0163341 A1 | 6/2013 | Yip | |
| 2013/0314987 A1* | 11/2013 | Hemink | G11C 16/3427 365/185.02 |
| 2014/0098593 A1* | 4/2014 | Calderoni | G11C 11/00 365/148 |
| 2014/0313823 A1* | 10/2014 | Kim | G11C 16/0483 365/185.03 |

OTHER PUBLICATIONS

Park, et al: "Three-Dimensional 128Gb MLC Vertical NAND Flash-Memory with 24-WL Stacked Layers and 50MB/s High-Speed Programming"; ISSCC 2014 / Session 19 / Nonvolatile Memory Solutions / 19.5; pp. 334-335.

(Continued)

*Primary Examiner* — Hoai V Ho
(74) *Attorney, Agent, or Firm* — McClure, Qualey & Rodack, LLP

(57) ABSTRACT

An operation method of a memory cell includes steps of applying a pre pulse before a read pulse is applied, wherein the pre pulse is larger than a maximum threshold voltage or less than a lowest threshold voltage.

20 Claims, 8 Drawing Sheets

(56) References Cited

OTHER PUBLICATIONS

Kang, et al.: "256Gb 3b/Cell V-NAND Flash Memory with 48 Stacked WL Layers"; ISSCC 2016 / Session 7 / Nonvolatile Memory Solutions / 7.1; pp. 130-131.
Park, et al: "Origin of transient Vth shift after erase and its impact on 2D/3D structure charge trap Flash memory cell operations"; 978-1-4673-4871-3/12/$31.00 © 2012 IEEE; pp. 2.4.1-2.4.4.

* cited by examiner

OPERATION METHOD OF NON-VOLATILE MEMORY CELL AND APPLICATIONS THEREOF

This application claims the benefit of U.S. provisional Ser. 62/363,349, filed Jul. 18, 2016, the subject matter of which is incorporated herein by reference.

BACKGROUND OF THE INVENTION

Field of the Invention

The invention relates in general to a method for operating a memory device and applications thereof, and more particularly to a method for operating a non-volatile memory (NVM) memory device and applications thereof.

Description of the Related Art

An NVM which is able to continually store information even when the supply of electricity is removed from the device containing the NVM cells. Recently, the most widespread used NVMs are charge trap flash (CTF) memory devices. However, as semiconductor features shrink in size and pitch, the CTF memory devices have its physical limitation of operation, and the bit density thereof cannot be further increased.

In order to solve the problems, a memory device having multi-level cells (MLCs) or triple-level cells (TLCs) each of which can save more than one bit of data per cell is provided. Since the channel layers of the MLCs or TLCs may have grain boundary traps that may trap electrons generated by the previous operations (e.g. erase/program operation), thus undesired transient current may occur during the read operation after the previous operations due to the trapped electrons. As a result, the sensing margin of the MLCs or TLCs threshold voltage (Vt) used to identify the memory state thereof may offset, and the memory states of the MLCs or TLCs determined by the read operation may not consistent with the real memory states originally identified by the verification operation that is performed right after the previous operations.

Therefore, there is a need of providing an improved method for operating an NVM device to obviate the drawbacks encountered from the prior art.

SUMMARY OF THE INVENTION

According to one embodiment of the present disclosure, an operation method of a memory cell is provided, wherein the operation method includes steps of applying a pre pulse before a read pulse is applied, wherein the pre pulse is larger than a maximum threshold voltage or less than a lowest threshold voltage.

According to another embodiment of the present disclosure, an operation method of a non-volatile memory is provided, wherein the operation method includes a programming operation, an erasing operation and a reading operation. The programming operation includes a first pre pulse before a programming verifying pulse and after a programming pulse. The erasing operation includes a second pre pulse before an erasing verifying pulse and after an erasing pulse. The reading operation includes a third pre pulse before a read pulse.

According to yet another embodiment of the present disclosure, a circuitry for performing an operation of a three dimensional (3D) non-volatile memory device is provided, wherein the circuitry includes a programming circuit for performing a programming operation, an erasing circuit for performing an erasing operation and a reading circuit for performing a reading operation. The programming operation includes a first pre pulse before a programming verifying pulse and after a programming pulse. The erasing operation includes a second pre pulse before an erasing verifying pulse and after an erasing pulse. The reading operation includes a third pre pulse before a read pulse.

In accordance with the aforementioned embodiments of the present disclosure, a method for operating an NVM device is provided. A pre-verifying pulse or a pre-reading pulse may be applied to a memory cell (e.g. a MLC) of the NVM prior to a programming/erasing verification operation or a read operation to moderate transient current disturbance due to the electrons trapped in the channel layer of memory cell occurred by a previous program/erase operation, so as to make the memory states of the memory cell determined by a subsequent read operation consisting with the real memory states identified by the programming/erasing verification operation. As a result, the operation stability of the NVM can be improved significantly.

In one embodiment, the pre-reading pulse applied to the memory cell prior to the read operation and the programming pulse applied to the memory cell during the program operation have an identical conductivity; and the pre-reading pulse has a voltage substantially greater than a highest threshold voltage of a plurality of predetermined threshold voltages used be verified during the programming verification operation. In another embodiment, the pre-verifying pulse applied to the memory cell prior to the programming verification operation and the programming pulse applied to the memory cell during the program operation have opposite conductivities; and the pre-verifying pulse has a voltage absolute value substantially greater than an absolute value of a predetermined erasing threshold voltage of the memory cell. In yet another embodiment, the pre-verifying pulse applied to the memory cell prior to the erasing verification operation and the erasing pulse applied to the memory cell during the erase operation have opposite conductivities; and the pre-verifying pulse has a voltage substantially greater than the predetermined erasing threshold voltage of the memory cell.

BRIEF DESCRIPTION OF THE DRAWINGS

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
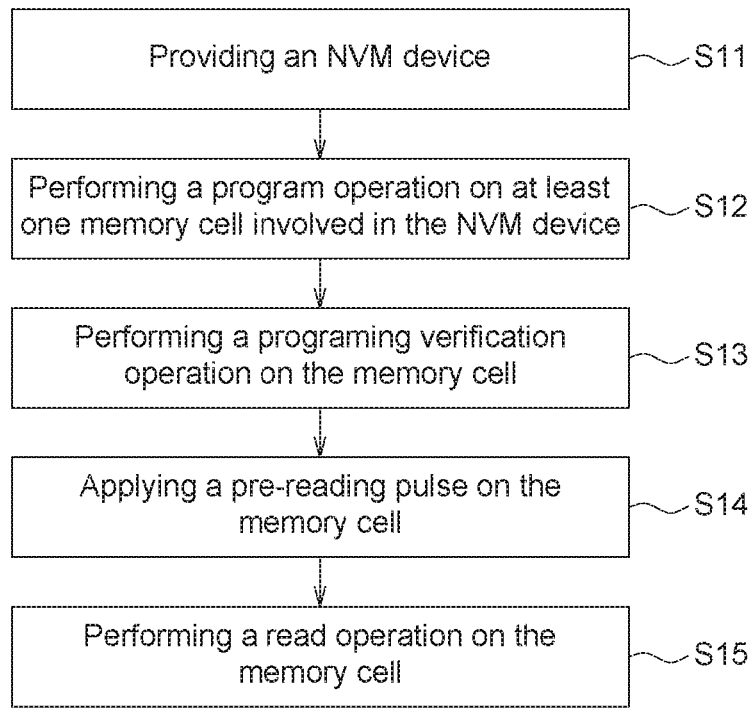
FIG. 1A is a process flow diagram illustrating a method for operating an NVM device in accordance with one embodiment of the present disclosure.

A method for operating an NVM device is provided to resolve the problems of memory state inconsistency between the memory states determined by a subsequent read operation and the real memory states identified by a programming/erasing verification operation. A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

Figure 1B:
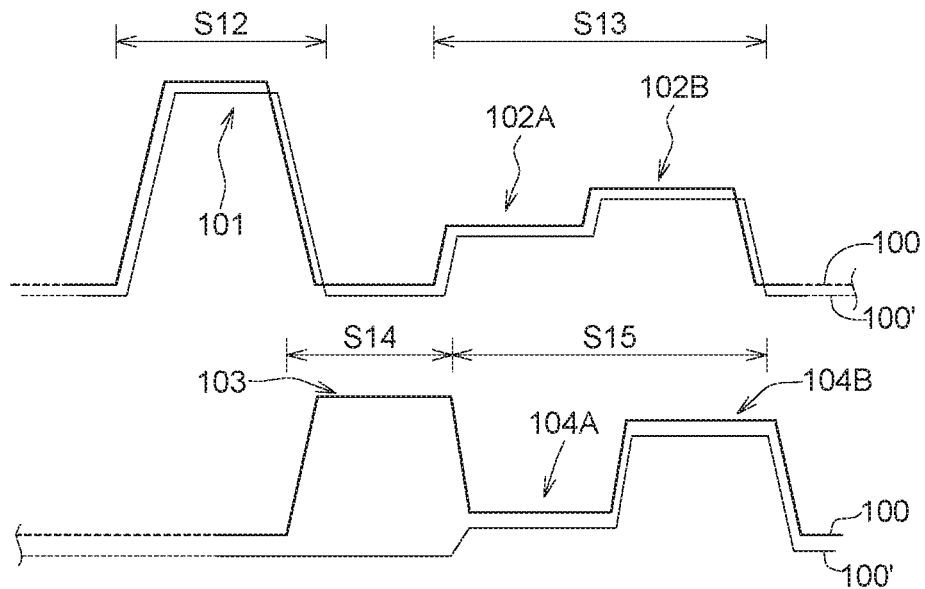
FIG. 1B is a timing diagram illustrating two different programming operations respectively using the method depicted in FIG. 1A and a method provided by a first comparison embodiment.

FIG. 1A is a process flow diagram illustrating a method 100 for operating an NVM device in accordance with one embodiment of the present disclosure. FIG. 1B is a timing diagram illustrating two different programming operations respectively using the method 100 depicted in FIG. 1A and a method 100' provided by a first comparison embodiment. Since the method 100 depicted in FIG. 1A is similar to the method 100' provided by the first comparison embodiment, except that the method 100' provided by the first comparison embodiment omits the step S14 of the method 100 as described below, thus the detailed steps and parameters of the method 100' will not be redundantly repeated here.

The method 100 for operating an NVM device includes steps as follows: Firstly, an NVM device is provided (see the step S11). In some embodiments of the present disclosure, the NVM device may include a plurality of MLCs or TLCs. In the present embodiment, the NVM device includes a plurality of MLCs.

Next, a program operation is performed on at least one memory cell involved in the NVM device (see the step S12) to give the memory cell a plurality of programmed memory states. For example, in some embodiments of the present disclosure, the program operation includes steps of applying a positive programming pulse 101 to the memory cells. The programming pulse 101 can has a voltage substantially ranging from 16V to 24V and a tunneling field substantially ranging from 9 MV/cm to 13 MV/cm. In the present embodiment, the programming pulse 101 can has a voltage about 20V, and the tunneling field of the programming pulse 101 preferably is about 12 MV/cm. The programmed memory states of the memory cell can be referred to the distribution states of a plurality of threshold voltages.

A programming verification operation is then performed on the memory cell (see the step S13) to determine whether a plurality of threshold voltages with reference to the programmed memory states reach a plurality of predetermined voltages respectively. The verifying results (i.e. "Yes" or "No") can be converted into a binary numbers (such as "0" or "1") used to represent a plurality of memory states. In the present embodiment, the programming verification operation includes steps of applying two verifying pulse 102A and 102B to the memory cell in sequence. The verifying pulse 102A has a first programming verifying level substantially ranging from 1V to 1.5V; and the verifying pulse 102A has a MLC programming verifying level substantially ranging from 3V to 3.5V.

Thereinafter, a pre-reading pulse 103 is applied on the memory cell (see the step S14). The pre-reading pulse 103 and the programming pulse 101 have an identical conductivity; and the pre-reading pulse 103 has a voltage substantially greater than a highest threshold voltage of the predetermined voltages. For example, in some embodiments of the present disclosure, the pre-reading pulse 103 may have a voltage ranging from 6V to 8V, a tunneling field substantially less than 5 MV/cm and a pulse width ranging from 5 microsecond (µs) to 15 µs. The voltage of the pre-reading pulse 103 preferably greater than the highest threshold voltage of the predetermined voltages about 1V. In the present embodiment, the pre-reading pulse 103 has a voltage ranging about 7V, a tunneling field substantially about 4 MV/cm and a pulse width about 10 µs.

Subsequently, a read operation is performed (see the step S15) to read the programmed memory states. In some embodiments of the present disclosure, the read operation includes steps of applying a plurality of reading pulses, such as reading pulses 104A and 104B, to read the threshold voltage distribution states of the memory cell. In the present embodiment, the reading pulses 104A has a first read level substantially ranging from 0V to 0.5V; and the reading pulses 104B has a MLC read level substantially ranging from 2V to 2.5V.

Figure 2:
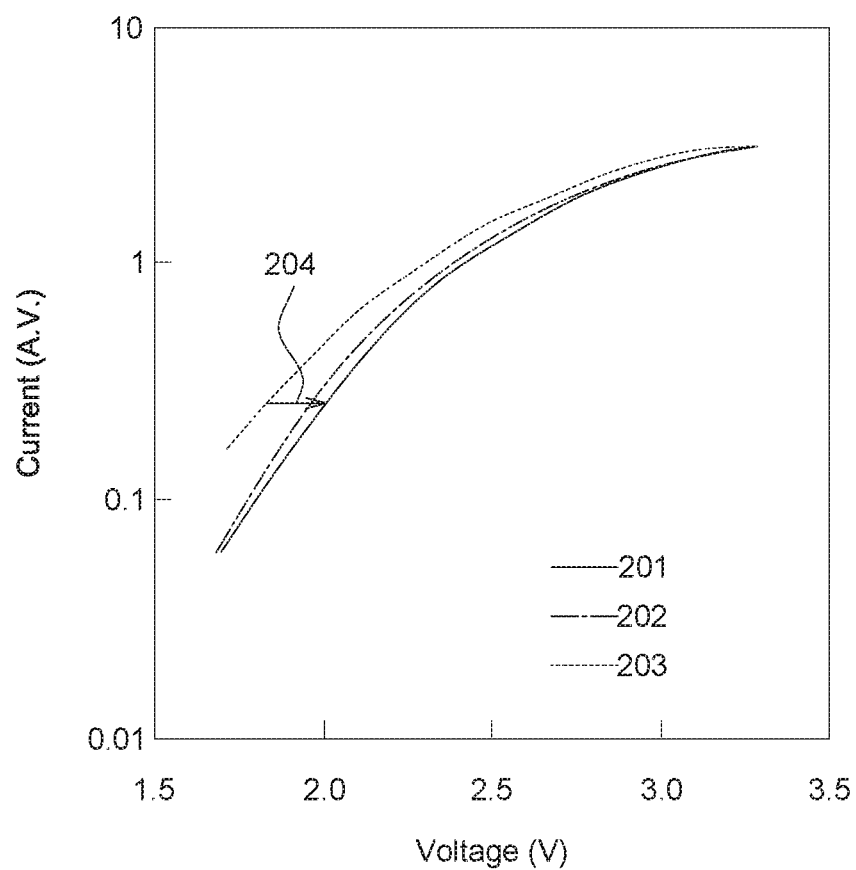
FIG. 2 is a schematic diagram illustrating voltage-current curves of a memory cell obtained by using the method depicted in FIGS. 1A and 1B and the method provided by the first comparison embodiment during the programming verification operation and the read operation respectively.

FIG. 2 is a schematic diagram illustrating voltage-current curves of a memory cell obtained by using the method 100 depicted in FIGS. 1A and 1B and the method 100' provided by the first comparison embodiment during the programming verification operation and the read operation respectively. Curve 201 is obtained by using the method 100 depicted in FIGS. 1A and 1B and represents the voltage-current relationship of the memory cell during the read operation (as shown in step S15) after the pre-reading pulse 103 is applied (as shown in step S14) to the memory cell. Curve 202 represents the voltage-current distribution of the memory cell during the programming verification operation (as shown in step S13) after the memory cell subjected to the program operation (as shown in step S12). Curve 203 is obtained by using the method 100' provided by the first comparison embodiment and represents the voltage-current relationship of the memory cell without applying the pre-reading pulse 103 to the memory cell prior to the read operation.

According to FIG. 2, curve 202 departures from curve 203. It can be indicated that the programmed memory states of the memory cell obtained by the programming verification operation is not consistent with the memory states of the memory cell obtained by the read operation, after the operations using the method 100' provided by the first comparison embodiment are performed. In contrast, curve 202 and curve 201 almost coincide with each other. It can be indicated that the programmed memory states of the memory cell obtained by the programming verification operation is rather consistent with the memory states of the memory cell obtained by the read operation, after the operations using the method 100 depicted in FIGS. 1A and 1B are performed.

Because the only difference between the method 100 depicted in FIGS. 1A and 1B and the method 100' provided by the first comparison embodiment is that the method 100' provided by the first comparison embodiment omits the step of applying the pre-reading pulse 103 to the memory cell (as shown in step S14). It is therefore deduced that more electrons may be trapped in the channel layer of the memory cell by applying the pre-reading pulse 103 to the memory cell (as shown in step S14), whereby transient current may be triggered during the read operation (as shown in step S14), and curve 203 that represents voltage-current relationship of the read operation without applying the pre-reading pulse 103 may be driven laterally approaching to curve 201 that represents the voltage-current relationship of the read operation using the method 100 depicted in FIGS. 1A and 1B (see the arrow 204). As a result, the memory states of the memory cell determined by the read operation (as shown in step S15) can be consistent with the real memory states identified by the programming verification operation (as shown in step S13). The operation stability of the NVM can be improved significantly.

Figure 3A:
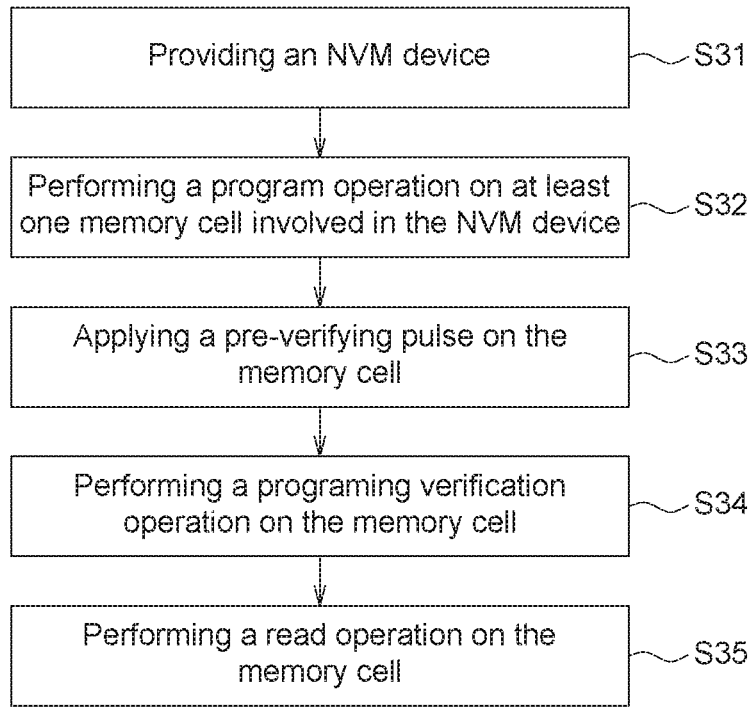
FIG. 3A is a process flow diagram illustrating a method for operating an NVM device in accordance with another embodiment of the present disclosure.
Figure 3B:
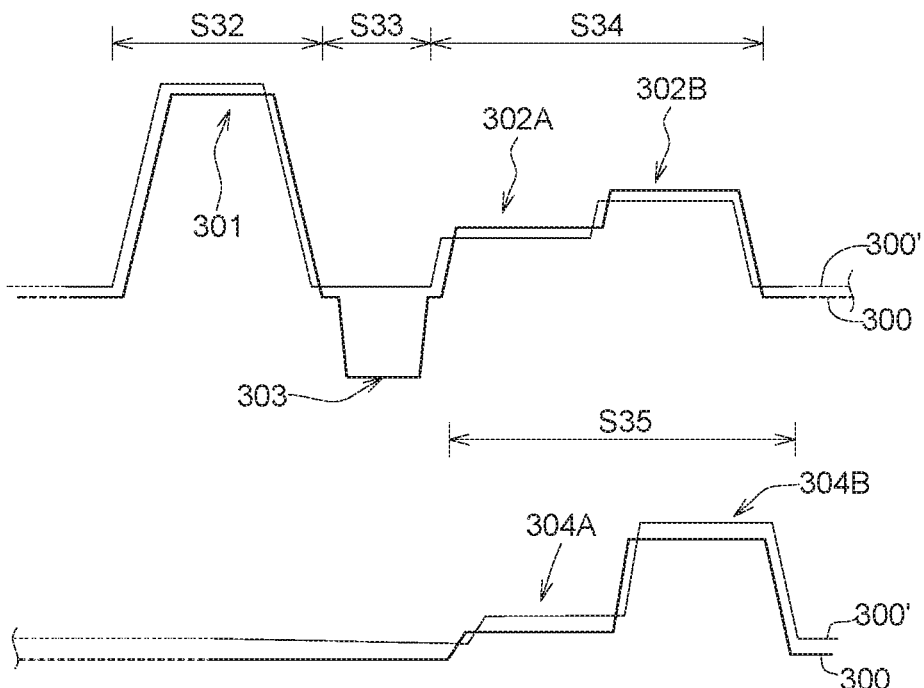
FIG. 3B is a timing diagram illustrating two different programming operations respectively using the method depicted in FIG. 3A and a method provided by a second comparison embodiment.

FIG. 3A is a process flow diagram illustrating a method 300 for operating an NVM device in accordance with one embodiment of the present disclosure. FIG. 3B is a timing diagram illustrating two different programming operations respectively using the method 300 depicted in FIG. 3A and a method 300' provided by a second comparison embodiment. Since the method 300 depicted in FIG. 3A is similar to the method 300' provided by the second comparison embodiment, except that the method 300' provided by the second comparison embodiment omits the step S33 of the method 300 as described below, thus the detailed steps and parameters of the method 300' will not be redundantly repeated here.

The method 300 for operating an NVM device includes steps as follows: Firstly, an NVM device is provided (see the step S31). In some embodiments of the present disclosure, the NVM device may include a plurality of MLCs or TLCs. In the present embodiment, the NVM device includes a plurality of MLCs.

Next, a program operation is performed on at least one memory cell involved in the NVM device (see the step S32) to give the memory cell a plurality of programmed memory states. For example, in some embodiments of the present disclosure, the program operation includes steps of applying a positive programming pulse 301 to the memory cell. The programming pulse 301 has a voltage substantially ranging from 16V to 24V and a tunneling field substantially ranging from 9 MV/cm to 13 MV/cm. In the present embodiment, the programming pulse 301 has a voltage about 20V; and the tunneling field of the programming pulse 301 is preferably about 12 MV/cm. The programmed memory states of the memory cell can be referred to the distribution states of a plurality of threshold voltages.

A pre-verifying pulse 303 is then applied on the memory cell (see the step S33). The pre pulse, such as a pre-verifying pulse 303 and the programming pulse 301 have opposite conductivities; and the pre-verifying pulse 303 has a voltage absolute value substantially greater than an absolute value of a predetermined erasing threshold voltage of the memory cell. In other words, the pre-verifying pulse 303 has a voltage substantially less than a lowest threshold voltage. For example, in some embodiments of the present disclosure, the predetermined erasing threshold voltage of the memory cell may range from −3V to −5V. The pre-verifying pulse 303 may have a voltage substantially less than −5V, preferably ranging from −5V to −8V, a tunneling field substantially less than 5 MV/cm and a pulse width ranging from 5 μs to 151 μs. In the present embodiment, the pre-verifying pulse 303 has a voltage ranging about −6V, a tunneling field substantially about 4 MV/cm and a pulse width about 10 μs.

Subsequently, a programming verification operation is performed on the memory cell (see the step S34) to determine whether a plurality of threshold voltages with reference to the programmed memory states reach a plurality of predetermined voltages respectively. The verifying results (i.e. "Yes" or "No") can be converted into a binary numbers (such as "0" or "1") used to represent a plurality of memory states. In the present embodiment, the programming verification operation includes steps of applying two read pulses, such as verifying pulses 302A and 302B to the memory cell in sequence. The verifying pulse 302A has a first read level substantially ranging from 1V to 1.5V; and the verifying pulse 302B has a MLC read level substantially ranging from 3V to 3.5V.

Thereinafter, a read operation is performed (see the step S35) to read the programmed memory states. In some embodiments of the present disclosure, the read operation includes steps of applying a plurality of reading pulses, such as reading pulses 304A and 304B, to read the threshold voltage distribution states of the memory cell.

Figure 4:
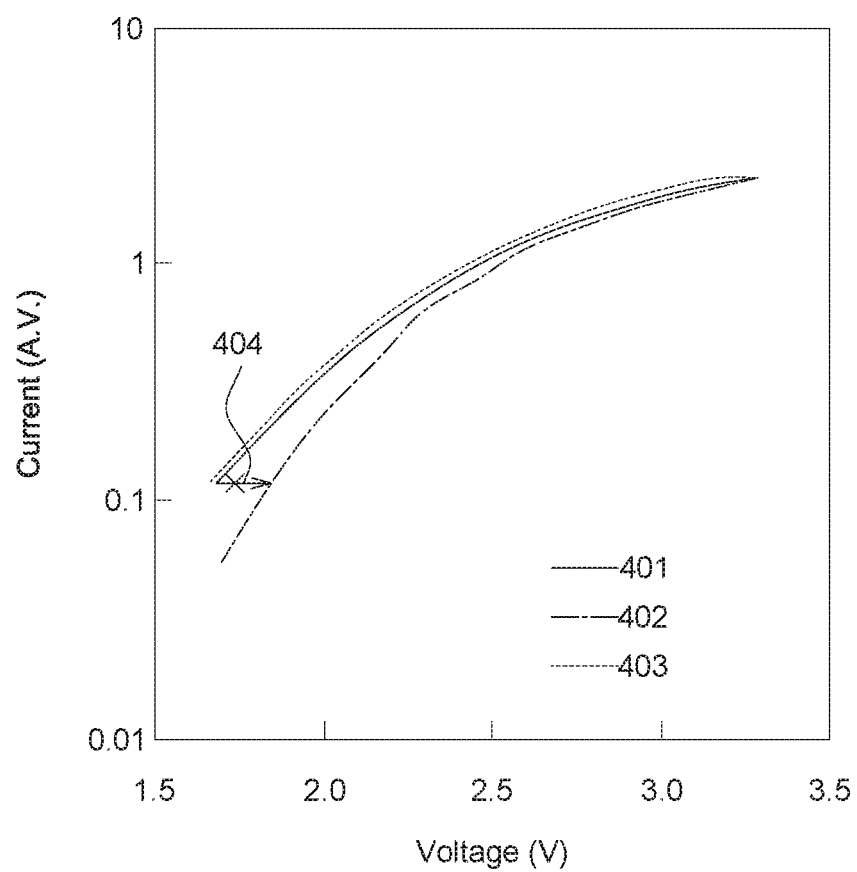
FIG. 4 is a schematic diagram illustrating voltage-current curves of a memory cell obtained by using the method depicted in FIGS. 3A and 3B and the method provided by the second comparison embodiment during the programming verification operation and the read operation respectively.

FIG. 4 is a schematic diagram illustrating voltage-current relationship of a memory cell obtained by using the method 300 depicted in FIGS. 3A and 3B and the method 300' provided by the second comparison embodiment during the programming verification operation and the read operation respectively. Curve 401 is obtained by using the method 300 depicted in FIGS. 3A and 3B and represents the voltage-current relationship of the programming verification operation (as shown in step S34) after the pre-verifying pulse 303 is applied (as shown in step S33) to the memory cell. Curve 402 is obtained by using the method 300' provided by the second comparison embodiment and represents the voltage-current relationship of the programming verification operation without applying the pre-verifying pulse 303 to the memory cell. Curve 403 is obtained by using the method 300 depicted in FIGS. 3A and 3B and represents the voltage-current relationship of the read operation.

According to FIG. 4, curve 402 departures from curve 403. It can be indicated that the programmed memory states of the memory cell obtained by the programming verification operation is not consistent with the memory states of the memory cell obtained by the read operation, after the operations using the method 300' provided by the second comparison embodiment are performed. In contrast, curve 403 and curve 401 almost coincide with each other. It can be indicated that the programmed memory states of the memory cell obtained by the programming verification operation is rather consistent with the memory states of the memory cell obtained by the read operation, after the operations using the method 300 depicted in FIGS. 3A and 3B are performed.

Because the only difference between the method 300 depicted in FIGS. 3A and 3B and the method 300' provided by the second comparison embodiment is that the method 300' provided by the second comparison embodiment omits the step of applying the pre-verifying pulse 303 to the memory cell (as shown in step S33). It is therefore deduced that electrons trapped in the channel layer of the memory cell may be removed by applying the pre-verifying pulse 303 to the memory cell (as shown in step S33), whereby the transient current occurred during the programming verification operation (as shown in step S34) may be reduced, so as to prevent curve 401 that represents the voltage-current relationship of the programming verification operation (as shown in step S34) from laterally approaching to curve 402 that represents the voltage-current relationship of the programming verification operation without applying the pre-verifying pulse 303 (see the arrow 404). As a result, the memory states of the memory cell determined by the read operation (as shown in step S35) can be consistent with the real memory states identified by the programming verification operation (as shown in step S34). The operation stability of the NVM can be improved significantly.

Figure 5A:
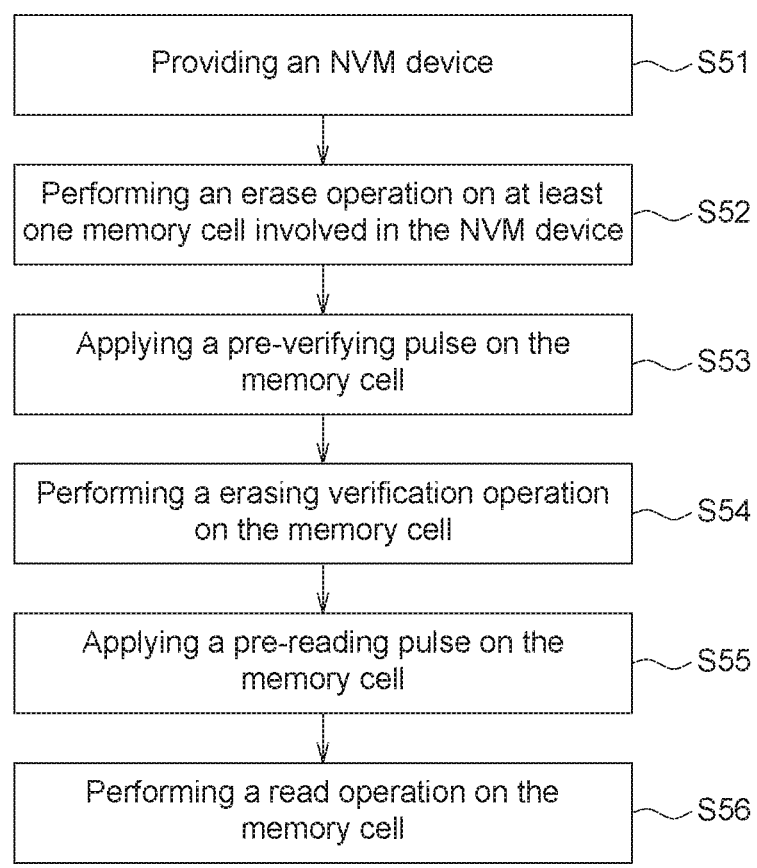
FIG. 5A is a process flow diagram illustrating a method for operating an NVM device in accordance with yet another embodiment of the present disclosure.
Figure 5B:
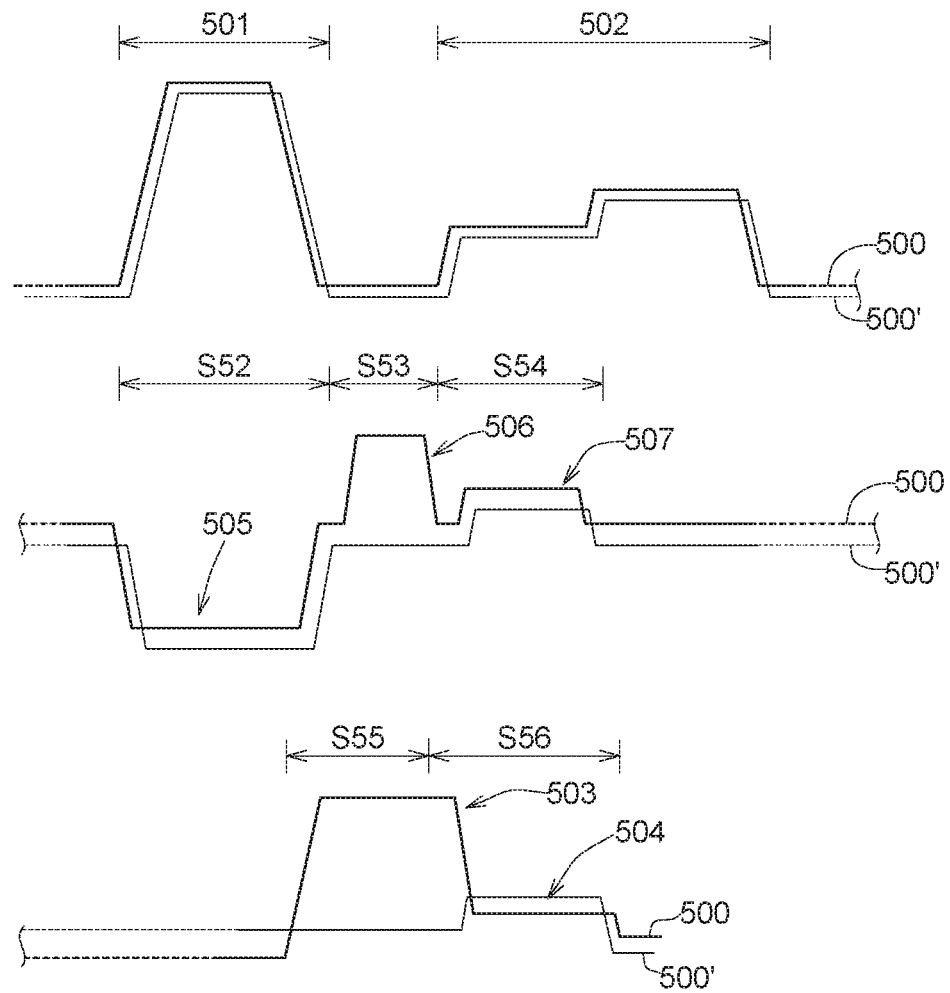
FIG. 5B is a timing diagram illustrating two different erasing operations respectively using the method depicted in FIG. 5A and a method provided by a third comparison embodiment.

FIG. 5A is a process flow diagram illustrating a method 500 for operating an NVM device in accordance with one embodiment of the present disclosure. FIG. 5B is a timing diagram illustrating two different erasing operations respectively using the method 500 depicted in FIG. 5A and a method 500' provided by a third comparison embodiment. Since the method 500 depicted in FIG. 5A is similar to the method 500' provided by the third comparison embodiment, except that the method 500' provided by the third comparison embodiment omits the steps S53 and S55 of the method 500 as described below, thus the detailed steps and parameters of the method 500' will not be redundantly repeated here.

The method 500 for operating an NVM device includes steps as follows: Firstly, an NVM device is provided (see the step S51). In some embodiments of the present disclosure, the NVM device may include a plurality of MLCs or TLCs. In the present embodiment, the NVM device includes a plurality of MLCs.

Next, an erase operation is performed on at least one memory cell involved in the NVM device (see the step S52) to give the memory cell an erased memory state. For example, in some embodiments of the present disclosure, the erase operation includes steps of applying a negative erasing pulse 505 to the memory cell. The erasing pulse 505 has a voltage substantially ranging from −16V to −20V and a tunneling field substantially ranging from 9 MV/cm to 13 MV/cm. In the present embodiment, the erasing pulse 505 has a voltage about −18V; and the tunneling field of the erasing pulse 505 is preferably about 12 MV/cm. The erased memory states of the memory cell can be referred to the distribution states of the erased threshold voltage.

A pre pulse, such as a pre-verifying pulse 506 is then applied on the memory cell (see the step S53). The pre-verifying pulse 506 and the erasing pulse 505 have opposite conductivities; and the pre-verifying pulse 506 has a voltage substantially greater than a predetermined erased threshold voltage of the memory cell applied in the subsequent erasing verification operation (see the step S54). For example, in some embodiments of the present disclosure, the pre-verifying pulse 506 may have a voltage substantially ranging from 2V to 8V, a tunneling field substantially less than 5 MV/cm and a pulse width ranging from 5 μs to 15 μs. The predetermined erased threshold voltage of the memory cell applied in the subsequent erasing verification operation may substantially range from −3V to −5V; and the pre-verifying pulse 506 may greater than the predetermined erased threshold voltage about 1V.

However, the voltage of the erasing pulse 505 and the pre-verifying pulse 506 may not be limited to this regards. In some other embodiment, the erase operation can include steps of applying a positive erasing pulse (not shown) to give the memory cell an erased memory state. The pre-verifying pulse has a negative conductivity.

If the memory cell has been subjected to a program operation 501 and a programming verification operation 502 prior to the erase operation (as shown in step S52), the pre-verifying pulse 506 may greater than the highest threshold voltage of the predetermined voltages applied in the programming verification operation 502. For example, the pre-verifying pulse 506 may substantially rage from 6V to 8V. In the present embodiment, the pre-verifying pulse 506 has a voltage ranging about 7V, a tunneling field substantially about 4 MV/cm and a pulse width about 10 μs.

Subsequently, an erasing verification operation is performed on the memory cell (see the step S54) to determine whether the threshold voltages of the memory cell reach the predetermined erased threshold voltage (erase level) respectively. The verifying results (i.e. "Yes" or "No") can be converted into a binary numbers (such as "0" or "1") used to determine whether the memory cell is in an erased memory state. In the present embodiment, the erasing verification operation includes steps of applying an erasing verifying pulse 507 to the memory cell. The erasing verifying pulse 507 has a voltage substantially ranging from −2V to −1.5V.

Thereinafter, a pre-reading pulse 503 is optionally applied to the memory cell (see the step S55). The pre-reading pulse 503 and the programming pulse applied in the program operation 501 have an identical conductivity; and the pre-reading pulse 503 has a voltage substantially greater than a highest threshold voltage of the predetermined voltages applied in the programming verification operation 502. For example, in some embodiments of the present disclosure, the pre-reading pulse 503 may have a voltage ranging from 6V to 8V, a tunneling field substantially less than 5 MV/cm and a pulse width ranging from 5 μs to 15 μs. The voltage of the pre-reading pulse 503 preferably greater than the highest threshold voltage of the predetermined voltages about 1V. In the present embodiment, the pre-reading pulse 503 has a voltage ranging about 7V, a tunneling field substantially about 4 MV/cm and a pulse width about 10 μs.

Subsequently, a read operation is performed (see the step S56) to read the erased memory states. In some embodiments of the present disclosure, the read operation includes steps of applying reading pulses 504 to read the threshold voltage distribution states of the memory cell. In the present embodiment, the reading pulses 504 may substantially ranging from −1V to −0.5V.

Figure 6:
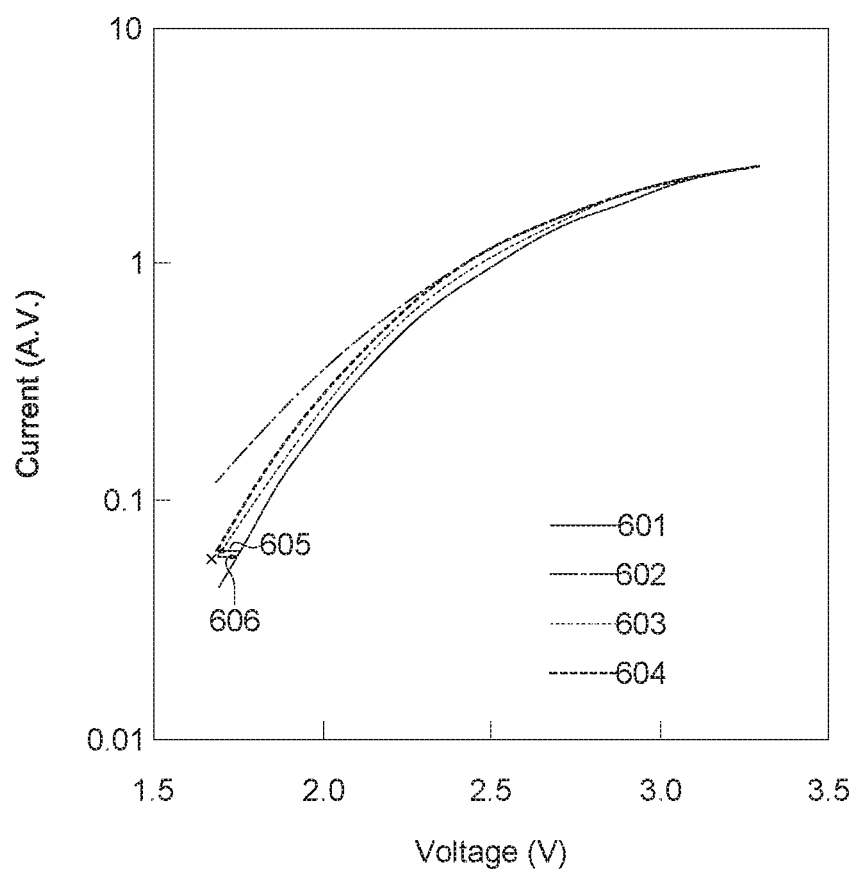
FIG. 6 is a schematic diagram illustrating voltage-current curves of a memory cell obtained by using the method depicted in FIGS. 5A and 5B and the method provided by the third comparison embodiment during the erasing verification operation and the read operation respectively.

FIG. 6 is a schematic diagram illustrating voltage-current relationship of the memory cell obtained by using the method 500 depicted in FIGS. 5A and 5B and the method 500' provided by the third comparison embodiment during the erasing verification operation and the read operation respectively. Curve 601 is obtained by using the method 500 depicted in FIGS. 5A and 5B and represents the voltage-current relationship of the erasing verification operation (as shown in step S54) after the pre-verifying pulse 506 is applied (as shown in step S53) to the memory cell. Curve 602 is obtained by using the method 500' provided by the third comparison embodiment and represents the voltage-current relationship of the erasing verification operation without applying the pre-verifying pulse 506 to the memory cell. Curve 603 is obtained by using the method 500 depicted in FIGS. 5A and 5B and represents the voltage-current relationship of the read operation (as shown in step S56), after the pre-reading pulse 503 is applied (as shown in step S55) to the memory cell. Curve 604 is obtained by using the method 500' provided by the third comparison embodiment and represents the voltage-current relationship of the read operation without applying the pre-reading pulse 503 to the memory cell.

According to FIG. 6, curve 602 departures from curve 604. It can be indicated that the erased memory states of the memory cell obtained by the erasing verification operation is not consistent with the memory states of the memory cell obtained by the read operation, after the operations using the method 500' provided by the third comparison embodiment are performed. In contrast, curve 601 and curve 603 almost coincide with each other. It can be indicated that the erased memory states of the memory cell obtained by the erasing verification operation is rather consistent with the memory states of the memory cell obtained by the read operation, after the operations using the method 500 depicted in FIGS. 5A and 5B are performed.

Because the only difference between the method 500 depicted in FIGS. 5A and 5B and the method 500' provided by the third comparison embodiment is that the method 500' provided by the third comparison embodiment omits the steps of applying the pre-verifying pulse 506 (as shown in step S53) and pre-reading pulse 503 to the memory cell (as shown in step S55). It is therefore deduced that more electrons may be trapped in the channel layer of the memory cell by applying the pre-verifying pulse 506 to the memory cell (as shown in step S53), whereby transient current occurred during the subsequent erasing verification operation (as shown in step S54) may be reduced, so as to prevent curve 601 that represents the voltage-current relationship of the erasing verification operation (as shown in step S54) from laterally approaching to curve 602 that represents the voltage-current relationship of the erasing verification operation without applying the pre-verifying pulse (see the arrow 605). In addition, more electrons may be trapped in the channel layer of the memory cell by applying the pre-reading pulse 503 to the memory cell (as shown in step S55), whereby transient current may be triggered during the read operation (as shown in step S56), and curve 603 that represents voltage-current relationship of the read operation with applying the pre-reading pulse 503 may be driven laterally approaching to curve 601 that represents the voltage-current relationship of the erasing verification operation using the method 500 depicted in FIGS. 5A and 5B (see the arrow 606). As a result, curve 601 that represents the voltage-current relationship of the erasing verification operation (as shown in step S54) and curve 603 that represents the voltage-current relationship of the read operation using the method 500 depicted in FIGS. 5A and 5B can get closer with each other. In other words, the memory states of the memory cell determined by the read operation (as shown in step S56) can be consistent with the real memory states identified by the erasing verification operation (as shown in step S54). The operation stability of the NVM can be improved significantly.

Figure 7:
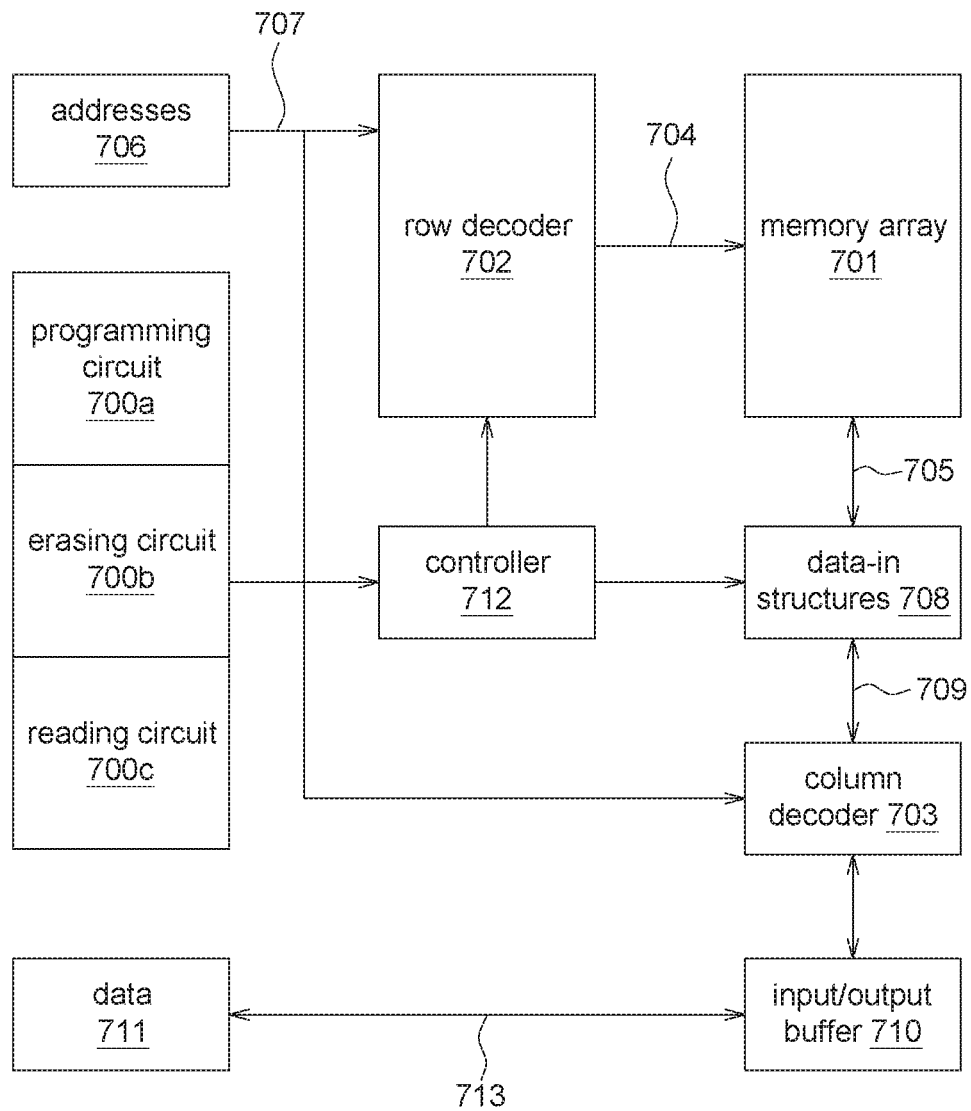
FIG. 7 is a block diagram illustrating an integrated circuit for performing an operation of a three dimensional (3D) non-volatile memory device in accordance with one embodiment of the present embodiment.

FIG. 7 is a block diagram illustrating an integrated circuit 700 for performing an operation of non-volatile memory device in accordance with one embodiment of the present embodiment. The integrated circuit 700 includes a memory array 701, a row decoder 702, a column decoder 703, sense amplifiers and data-in structures 708 and a controller 712.

The row decoder 702 and the column decoder 703 are coupled to the memory array 701 through a plurality of word lines 704 and a plurality of bit lines 705 respectively. Addresses 706 are supplied on a bus 707 to the column decoder 703 and the row decoder 702. The sense amplifiers and data-in structures 708 are coupled to the column decoder 703 via a data bus 709. Data 711 is supplied via the data-in line 713 to the input/output buffer 710 on the integrated circuit 700, and then transmitted to the sense amplifiers and data-in structures 708 through the input/output buffer 710.

The controller 712, in the present embodiment, can control the bias arrangement supply voltage generated through the voltage supplies according to the commands coming from a programming circuit 700a, an erasing circuit 700b and a reading circuit 700c to provided pulses, such as pre pulses, reading pulses, erasing pulses, programming pulses, erase verifying pulses and program verifying pulses, for performing programming operations, erasing operations and reading operations. The controller 712 can be implemented using special-purpose logic circuitry as known in the art. In alternative embodiments, the controller 712 comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller 712.

In accordance with the aforementioned embodiments of the present disclosure, a method for operating an NVM device is provided. A pre-verifying pulse or a pre-reading pulse may be applied to a memory cell (e.g. a MLC) of the NVM prior to a programming/erasing verification operation or a read operation to moderate transient current disturbance due to the electrons trapped in the channel layer of memory cell occurred by a previous program/erase operation, so as to make the memory states of the memory cell determined by a subsequent read operation consisting with the real memory states identified by the programming/erasing verification operation. As a result, the operation stability of the NVM can be improved significantly.

In one embodiment, the pre-reading pulse applied to the memory cell prior to the read operation and the programming pulse applied to the memory cell during the program operation have an identical conductivity; and the pre-reading pulse has a voltage substantially greater than a highest threshold voltage of a plurality of predetermined voltages that are to be verified during the programming verification operation. In another embodiment, the pre-verifying pulse applied to the memory cell prior to the programming verification operation and the programming pulse applied to the memory cell during the program operation have opposite conductivities; and the pre-verifying pulse has a voltage absolute value substantially greater than an absolute value of a predetermined erasing threshold voltage of the memory cell. In yet another embodiment, the pre-verifying pulse applied to the memory cell prior to the erasing verification operation and the erasing pulse applied to the memory cell during the erase operation have opposite conductivities; and the pre-verifying pulse has a voltage substantially greater than the predetermined erasing threshold voltage of the memory cell.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operation method of a non-volatile memory cell, comprising:
    applying a programming pulse to the non-volatile memory cell; and
    applying a first pre pulse to the non-volatile memory cell before a read pulse is applied, wherein the first pre pulse is larger than a maximum threshold voltage or less than a lowest threshold voltage of the non-volatile memory cell and has a conductivity opposite to that of the programming pulse.

2. The operation method according to claim 1, wherein the read pulse is a programming verifying pulse.

3. The operation method according to claim 2, wherein the programming verifying pulse comprise a first programming verifying level and a multi-level cell (MLC) programming verifying level.

4. The operation method according to claim 1, wherein the programming pulse ranges from 16V to 20V.

5. The operation method according to claim 1, wherein the first pre-pulse is less than the lowest threshold voltage and ranges from −5V to −6V.

6. The operation method according to claim 1, further comprising steps of applying an erasing pulse to the non-volatile memory cell after applying the programming pulse.

7. The operation method according to claim 6, further comprising:
    applying a second pre-pulse to the non-volatile memory cell after applying the erasing pulse; and
    applying an erasing verifying pulse to the non-volatile memory cell.

8. The operation method according to claim 7, wherein the erasing verifying pulse comprises an erase level.

9. The operation method according to claim 1, wherein the erasing pulse is −18V.

10. The operation method according to claim 7, wherein the second pre-pulse is larger than the maximum threshold voltage and ranges from 2V to 8V.

11. A operation method of a non-volatile memory cell, comprising;
    performing a programming operation comprising a first pre pulse before a programming verifying pulse and after a programming pulse on the non-volatile memory cell, wherein the first pre pulse and the programming pulse have opposite conductivities;
    performing an erasing operation comprising a second pre pulse before an erasing verifying pulse and after an erasing pulse on the non-volatile memory cell; and
    performing a reading operation comprising a third pre pulse before a read pulse on the non-volatile memory cell.

12. The operation method according to claim 11, wherein the first pre pulse is a programming verifying pre pulse, the second pre pulse is an erasing verifying pre pulse and the third pre pulse is a reading pre pulse.

13. The operation method according to claim 11, wherein the first pre-pulse is less than a lowest threshold voltage of the non-volatile memory cell and ranges from −5V to −6V.

14. The operation method according to claim 11, wherein the second pre-pulse is larger than a maximum threshold voltage of the non-volatile memory cell and ranges from 2V to 8V.

15. The operation method according to claim 11, wherein the third pre-pulse is larger than a maximum threshold voltage and ranges from 6V to 8V.

16. A circuitry for performing an operation of a non-volatile memory cell comprising;
    a programming circuit for performing a programming operation comprising a first pre pulse before a programming verifying pulse and after a programming pulse on the non-volatile memory cell, wherein the first pre pulse and the programming pulse have opposite conductivities;
    an erasing circuit for performing a erasing operation comprising a second pre pulse before an erasing verifying pulse and after a erasing pulse on the non-volatile memory cell; and
    a reading circuit for performing a reading operation comprising a third pre pulse before a read pulse on the non-volatile memory cell.

17. The circuitry according to claim 16, wherein the first pre pulse is a programming verifying pre pulse, the second pre pulse is an erasing verifying pre pulse and the third pre pulse is a reading pre pulse.

18. The circuitry according to claim 16, wherein the first pre-pulse is less than a lowest threshold voltage of the non-volatile memory cell and ranges from −5V to −6V.

19. The circuitry according to claim 16, wherein the second pre-pulse is larger than a maximum threshold voltage of the non-volatile memory cell and ranges from 2V to 8V.

20. The circuitry according to claim 16, wherein the third pre-pulse is larger than a maximum threshold voltage of the non-volatile memory cell and ranges from 6V to 8V.

* * * * *